United States Patent [19]

Anthony et al.

[11] 4,032,960

[45] * June 28, 1977

[54] ANISOTROPIC RESISTOR FOR ELECTRICAL FEED THROUGHS

[75] Inventors: Thomas R. Anthony; Harvey E. Cline, both of Schenectady, N.Y.

[73] Assignee: General Electric Company, Schenectady, N.Y.

[ * ] Notice: The portion of the term of this patent subsequent to Sept. 21, 1993, has been disclaimed.

[22] Filed: Jan. 30, 1975

[21] Appl. No.: 545,482

[52] U.S. Cl. .................................. 357/51; 357/60; 357/89; 357/90
[51] Int. Cl.² ................... H01L 27/02; H01L 29/04
[58] Field of Search ................... 357/51, 60, 89, 90

[56] References Cited

UNITED STATES PATENTS 3,617,399  11/1971  Fowler .............................. 357/51
3,624,467  11/1971  Bean ................................. 357/51

*Primary Examiner*—Edward J. Wojciechowicz
*Attorney, Agent, or Firm*—Donald M. Winegar; Joseph T. Cohen; Jerome C. Squillaro

[57] ABSTRACT

An anistropic resistor for electrical feed throughs embodies a body of semiconductor material having at least one channel region of recrystallized material of the body formed therein. The channel region extends entirely through, and terminates in two major opposed surfaces of, the body. The at least one region is formed by a temperature gradient zone melting process, has a substantially uniform level of resistivity throughout the region and is electrically conductive.

33 Claims, 11 Drawing Figures

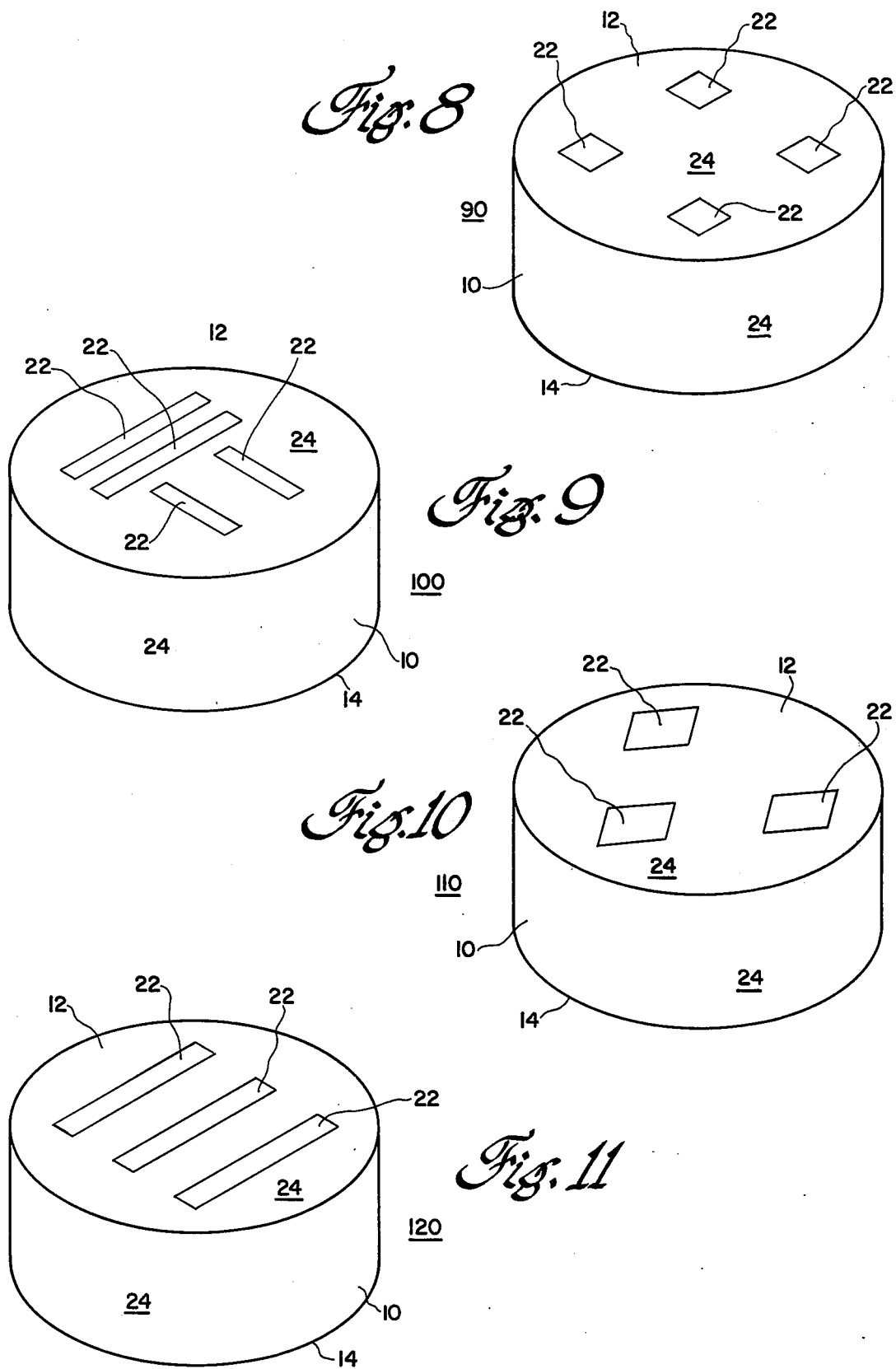

ANISOTROPIC RESISTOR FOR ELECTRICAL FEED THROUGHS

BACKGROUND OF THE INVENTION

1. Field of the Invention

This invention relates to semiconductor anisotropic resistor feed throughs and a temperature gradient zone melting process for making the same.

2. Description of the Prior Art

Heretofore anisotropic resistor feed throughs have usually been made by providing a wafer of high resistivity material with a plurality of apertures. Each aperture extends entirely through the wafer from one opposed surface to the other opposed surface. Each of these apertures is designed to receive a high electrical conductivity electrode which is sealed to the low conductivity wafer around the perimeter of the aperture. In cases where the anisotropic resistor feed through is desired as a barrier between different environments on the opposed faces of the wafer, these seals must not leak. Most seals are susceptible to electrochemical attack between the highly conductive electrode and the high resistivity wafer because of the difference in chemical deposition between these two bodies and thus are liable to leakage after long exposure times. Moreover, when the two materials composing the matrix wafer and the electrodes have different coefficients of thermal expansion, temperature fluctuations can result in stresses and strains that give rise to leakage. If the difference in the ambient pressures in the two different environments to which the opposed surfaces of the anisotropic resistor feed through is exposed is large, then the anisotropic resistor feed through must have considerable thickness in order that the resistor have the mechanical strength to withstand the pressure differencial. For example, in a deep sea marine environment, an anisotropic resistor feed through may be exposed to both electrochemical attacks and high pressure differences. Finally, many anisotropic resistor feed throughs that are constructed of metal electrodes and cured organic resins are not resistive to either high temperatures or severe oxidizing environments.

An object of this invention is to provide a new and improved semiconductor anisotropic resistor feed through which corrects the deficiencies of the prior art devices.

Another object of this invention is to provide an anisotropic resistor feed through having an array of high conductivity channels of recrystallized semiconductor material in a thick wafer of high resistivity semiconductor material.

Another object of this invention is to provide a new and improved anisotropic resistor feed through including an array of high conductivity channels whose cross-sectional configuration may be round, square, triangular or diamond shape.

Another object of this invention is to provide a new and improved anisotropic resistor feed through whose chemical composition as far as electrochemical attack is concerned is the same in both the electrode and matrix region.

Another object of this invention is to provide a new and improved anisotropic resistor feed through having a wafer thickness as great as required to withstand large differences in pressure between the opposed faces of the wafer.

Another object of this invention is to provide a new and improved semiconductor anisotropic resistor feed through whose isolation between the high electrical conductivity electrode and low electrical conductivity matrix is a result not only of the difference in resistance between these two bodies but resulting from a blocking reversed bias P-N junction between the semiconductor electrode region and the semiconductor matrix region.

Another object of this invention is to provide a new and improved semiconductor anisotropic feed through whose high conductivity electrode and low conductivity matrix regions have the same coefficient of thermal expansion in order to minimize failure of the electrode as a result of stressing or the occurrance of leaks because of temperature fluctuations.

Another object of this invention is to provide a new and improved semiconductor anisotropic resistor feed through which is resistant to severely oxidizing environments.

Another object of this invention is to provide a new and improved semiconductor anisotropic resistor feed through which is not destroyed by exposure to high temperatures.

Other objects of this invention will, in part, be obvious and will, in part, appear hereinafter.

In accordance with the teachings of this invention, there is provided an anisotropic resistor comprising a body of single crystal semiconductor material having two major opposed surfaces, a first selected level of resistivity and a first type conductivity. The semiconductor material is one selected from the group consisting of silicon, silicon carbide, gallium arsenide, germanium, a coupound of a Group III element and a Group V element, and a compound of a Group II element and a Group VI element. At least one, or an array of, electrically conductive channel region is disposed in the body. Each channel region extends between, and terminates in, the two opposed major surfaces and has opposed end surfaces. Each end surface is coextensive with the respective major surface in which the end surface is disposed. The material of each of the channel regions is recrystallized semiconductor material of the body and has a second selected level of resistivity and a second type conductivity which may be the same as, or of opposite type conductivity to that of the body. The material of each of the channel regions has at least one metal impurity substantially uniformly distributed throughout the channel region, the concentration of which is sufficient to impart the second type conductivity and second selected level of resistivity thereto. The recrystallized material has a solid solubility of the impurity contained therein for the temperature at which the process was practiced. When the second type conductivity is the same as the first type conductivity, the resistance anisotropy of the feed or lead through will be derived solely from the resistivity difference between the material of the body and the material of the channel regions. When the second type conductivity is opposite to that of the first type conductivity, the resistance anisotropy of the feed or lead through will be derived both from the resistivity difference between the material of the body and that of the channel region and from the blocking characteristics of the P-N junction formed by the contiguous surfaces of the two materials.

Temperature gradient zone melting is utilized to produce that at least one channel region of the anisotropic resistor feed or lead through of this invention. A layer of metal which is the dopant material in itself, or includes a dopant material, is vapor deposited into one or more selectively etched depressions formed in a major surface of the body of semiconductor. The etched depressions are produced by a selective chemical etching and photolithography technique discussed in our following copending applications, all of the teachings therein being incorporated by reference thereto into this application: "Method of Making Deep Diode Devices", U.S. Pat. No. 3,901,736; "Deep Diode Device Production and Method", U.S. Pat. No. 3,919,801; "Deep Diode Devices and Method and Apparatus", Ser. No. 411,001, and now abandoned in favor of Ser. No. 522,154; "High Velocity Thermal Migration Method of Making Deep Diode Devices", U.S. Pat. No. 3,898,106; "Deep Diode Device Having Dislocation-Free P-N Junctions and Method", U.S. Pat. No. 3,902,925; and "The Stabilized Droplet Migration Method of Making Deep Diodes Having Uniform Electrical Properties", U.S. Pat. No. 3,899,361. The body or semiconductor wafer can have a < 111 >, a < 100 > or a < 110 > axial orientation. The etched depressions have, respectively, triangular, square and diamond shapes for the < 111 >, < 100 > and < 110 > axial wafers which will produce channel regions having respectively triangular, square and diamond shaped cross-sections. In addition, etched linear depressions of finite length with any line direction orientation on the < 111 > axial wafer, with a < 011 > and/or a < 0$\bar{1}$1 > line deduction on a < 100 > axial wafer and with a < $\bar{1}$10 > line direction on a < 110 > axial wafer will produce channel regions with rectangular cross-sections with a high aspect ratio.

The metal deposited in the etched depressions is migrated through the body or wafer of semiconductor material of the first type from the bottom face to the top opposed face of the wafer to form the channel regions. When each channel region is of an opposite conductivity relative to the body, P-N junction is formed which is a step junction. In particular, the migration of an array of aluminum-rich droplets through high resistivity N-type silicon will produce the P-N junctions and the desired configuration of channeled regions of a selective low level of resistivity and of P-type conductivity.

DESCRIPTION OF THE DRAWINGS

FIG. 8 is an isometric view of an anisotropic resistor processed from a < 100 > wafer of semiconductor material with low resistivity channels of square cross-section made in accordance with the teachings of this invention.

FIG. 9 is an isometric view of an anisotropic resistor processed from a < 100 > wafer of semiconductor material with low resistivity channels of a high aspect ratio rectangular cross-section made in accordance with the teachings of the invention.

FIG. 10 is an isometric view of an anisotropic resistor processed from a < 110 > axial wafer of semiconductor material with low resistivity channels of a diamond shaped cross-secton made in accordance with the teachings of this invention.

FIG. 11 is an isometric view of an anisotropic resistor feed through processed from < 110 > wafer of semiconductor material with low resistivity channels of a high aspect ratio rectangular cross-section made in accordance with the teachings of this invention.

DESCRIPTION OF THE INVENTION

Figure 1:
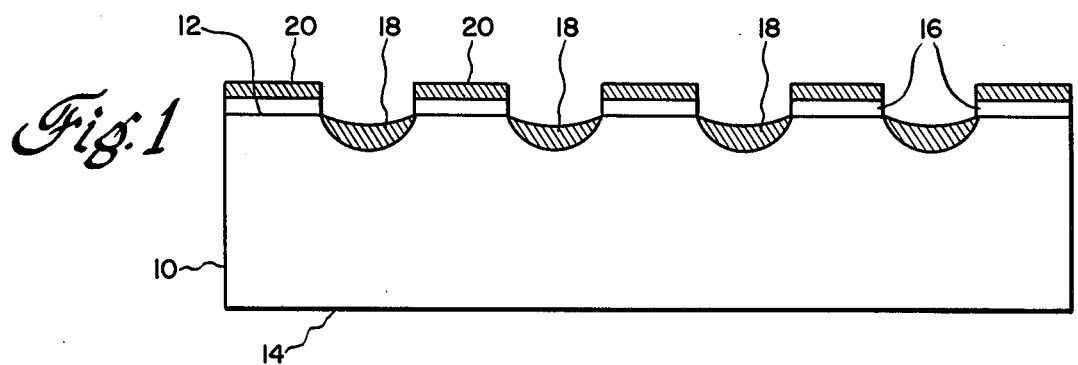
FIGS. 1, 2, 3 and 4 are elevation views, in cross-section, of a body of semiconductor material processed in accordance with the teachings of this invention.

With reference to FIG. 1, there is shown a body 10 of semiconductor material having a selected resistivity and a first type conductivity. The body 10 has two opposed major surfaces 12 and 14 which are the top and bottom surfaces respectively thereof. The semiconductor material comprising body 10 may be silicon, germanium, silicon carbide, gallium arsenide, a compound of a Group II element and a Group VI element, and a compound of a Group III element and a Group V element. In order to describe the invention in detail, the body 10 is said to be of silicon.

The body 10 is mechanically polished, chemically etched to remove any damaged surfaces, rinsed in deionized water and dried in air. An acid resistant mask 16 is disposed on surface 12 of body 10. Preferably, the mask is of silicon oxide which is either thermally grown or vapor deposited on the surface 12 by any of the materials well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80° C. A suitable mask of an array of either triangles on a < 111 > axial wafer, an array of squares on a < 100 > axial wafer, an array of diamond parallelograms on a < 110 > axial wafer, an array of finite lines with any line direction on a (111) axial wafer, an array of finite lines with line directions of < 011 > or < 0$\bar{1}$1 > on a < 100 > axial wafer, or an array of finite lines with a line direction of < 1$\bar{1}$0 > on a < 110 > wafer of a predetermined dimension and spaced a predetermined distance apart is disposed on the layer of photoresist and exposed to ultraviolet light. After exposure, the layer of photoresist is washed in xylene to open windows in the mask where the array is desired so as to be able to selectively etch the array pattern through the silicon oxide layer 16 exposed in the windows.

Each of the finite lines, triangles, squares and diamond parallelograms may each be of the same dimensions or of different dimensions, depending on the design of the anisotropic resistor device to be made.

Selective etching of the layer 16 of silicon oxide is accomplished with a buffered hydrofluoric acid solution (NH$_4$HF). The etching is continued until a second set of windows corresponding to the windows of the photoresist mask are opened in layer 16 of the silicon oxide to expose selective portions of the surface 12 of the body 10 of silicon. The processed body 10 is rinsed in deionized water and dried. The remainder of the photoresist mask is removed by immersion in concentrated sulphuric acid at 180° C or by immersion in a mixture of 1 part by volume hydrogen peroxide and 1 part by volume concentrated sulphuric acid.

Selective etching of the exposed surface area of body 10 is accomplished with a mixed acid solution of 10 parts by volume nitric acid (70%), four parts by volume acetic acid (100%), and one part by volume hydrofluoric acid (48%). At a temperature of from 20° to 30° C, the mixed solution selectively etches the silicon of body 10 at a rate of about 5 microns per minute.

A trough or depression is etched in the surface 12 of the body 10 beneath each window in the oxide layer 16. The selective etching is continued until the depth of the depressions 18 is approximately equal to the width of window in the silicon oxide layer 16. However, it has been discovered that the depression 18 should not be greater than approximately 100 microns in depth because undercutting of the silicon oxide layer 16 will occur. Etching for approximately 5 minutes at a temperature of 25° C will result in a depression 18 of approximately 25 to 30 microns in depth for a window width of from 10 to 500 microns. The etched body 10 is rinsed in distilled water and blown dry. Preferably, a gas such as, for example, as freon, argon and the like, is suitable for drying the processed body 10.

The processed body 10 is disposed in a metal evaporation chamber. A layer 20 of a suitable metal is deposited on the remaining portions of the layer 16 of silicon oxide and on the exposed silicon in the depressions 18. The metal in the depressions 18 is the metal droplets or wires to be migrated through body 10. The metal of the layer 20 comprises a material either substantially pure in itself or suitably doped by one or more materials to impart a second low resistivity and the same or the opposite type conductivity to the material of body 10 through which it migrates. The thickness of the metal layer 20 is approximately equal to the depth of the depression 18. Therefore, if depression 18 is 20 microns deep, the layer 20 is approximately 20 microns in thickness.

A suitable material for the metal layer 20 is aluminum to obtain low resistivity P$^+$-type regions in high resistivity N-type silicon semiconductor material. Another suitable material for the metal layer 20 is a gold-3% antimony alloy to obtain low resistivity N$^+$-type regions in high resistivity N-type silicon semiconductor material. Prior to migrating the metal droplets or wires in the depressions 18 through the body of silicon 10, the excess metal of layer 20 is removed from the silicon oxide layer 16 by such suitable means as grinding the excess metal with a 600 grit carbide paper or by selectively etching embodying photolithography techniques well known to those skilled in the art.

It has been discovered that the vapor deposition of the metal layer 20 should be performed at a pressure of less than $5 \times 10^{-5}$ torr. When the pressure is greater than $5 \times 10^{-5}$ torr, we have found that in the case of aluminum metal deposited in depressions 18 and gold-3 percent antimony deposited in depressions 18 that the metal does not reproducibly penetrate into the silicon and migrate through the body 10. It is believed that the metal layer is saturated with oxygen which prevents reduction of the very thin silicon oxide layer between the deposited metal and the silicon that was formed in the air shortly after etching of depressions 18. Thus the initial melt of the metal and the silicon required for migration is not obtained because of the inability of the metal to wet the silicon interface. In a similar manner, metal deposited by sputtering is not as desirable as the metal appears to be saturated with oxygen in the process thereby preventing the reduction of any intervening silicon oxide. The preferred methods of depositing the metal onto the silicon body 10 are by the electron beam method and the like wherein little, if any, oxygen is entrapped in the metal.

The processed body 10 is placed in a thermomigration apparatus, not shown, and the metal wires in the depressions 18 are migrated through the body 10 by a thermal gradient zone melting process. A thermal gradient of approximately 50° C/cm between the bottom face 14 which is the hot face and the surface 12 which is the cold face has been discovered to be appropriate. For aluminum migration, the average body temperature is from about 800° C to approximately 1400° C. For gold-3 percent antimony, average temperature of the body is from about 400° C to about 1400° C. The process is practiced for a sufficient length of time to migrate all the metal droplets and wires through the body 10. For example, for aluminum droplets and wires of 20 microns thickness, a thermal gradient of 50° C/cm., a 1200° C mean temperature of body 10, a pressure of $1 \times 10^{-5}$ torr, and a furnace time of less than 12 hours is required to migrate the wires and droplets through the silicon body 10 of one centimeter in thickness. For gold-3 percent antimony droplets and wires of 20 microns thickness, a thermal gradient of 50° C/cm., a 1100° C mean temperature of body 10, a pressure of $1 \times 10^{-5}$ torr and a furnace time of less than 12 hours is required to migrate the droplets and wires through the silicon body 10 1 centimeter in thickness.

The temperature gradient zone melting process and apparatus therefore is not part of this invention. For a more thorough understanding of the temperature gradient zone melting process employed in this invention and for a more thorough description of the apparatus employed for the process, one is directed to our copending applications which are incorporated herein by reference and entitled "Method of Making deep Diode Devices", U.S. Pat. No. 3,901,736; "Deep Diode Device Production and Method", U.S. Pat. No. 3,910,801; "Deep Diode Devices and Method and Apparatus", Ser. No. 411,001, and now abandoned in favor of Ser. No. 552,154; "High Velocity Thermonigration Method of Making Deep Diodes", U.S. Pat. No. 3,898,106; "Deep Diode Device Having Dislocation-Free P-N Junctions and Method", U.S. Pat. No. 3,902,925; and "The Stabilized Droplet Method of Making Deep Diodes Having Uniform Electrical Properties", U.S. Pat. No. 3,899,361. A more thorough discussion of which crystallographic planes are preferred for disposing the metal wires thereupon and the preferred crystal axis for migration is found in our copending application entitled "Deep Diode Line Migration," Ser. No. 411,018, assigned to the same assignee of this invention and included, in part, hereinafter.

Figure 2:
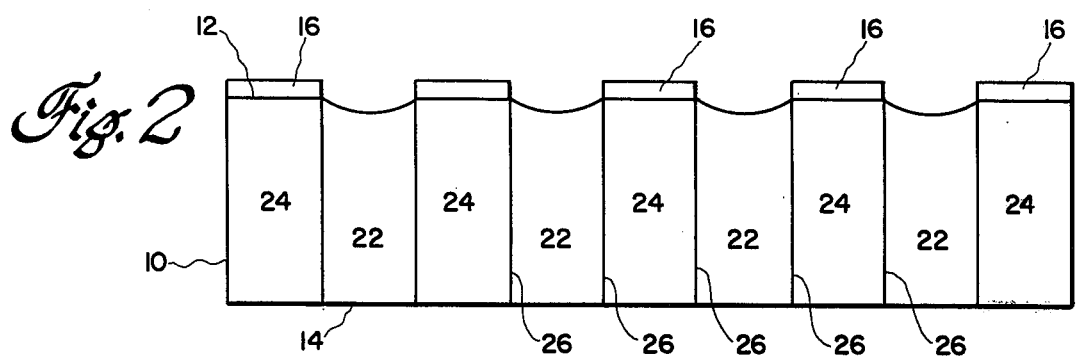

Upon completion of the temperature gradient zone melting process, the resulting processed body 10 is as shown in FIG. 2. The thermal migration of the metal droplets or metal wires through the body 10 produces a body having a plurality of spaced channel regions 22 of a second low resistivity. The regions 22 may be of the same or the opposite type conductivity of that of the regions 24 which the matrix material of high resistivity semiconductor material of the body 10. Each region 22 is recrystallized material of body 10 suitably doped with a material comprising the metal of the droplet or metal of the wire and having a sufficiently high impurity concentration to impart a low resistivity N⁺ or P⁺ characteristic to the region. The metal retained in the recrystallized region is substantially the maximum allowed by the solid solubility of the metal in the semiconductor material through which it has been migrated. It is recrystallized material of solid solubility of the metal therein. The region 22 has a constant uniform level of impurity concentration throughout the entire planar region. The thickness of the region 22 is substantially constant for the entire region. The peripheral surface of each planar region 22 comprises in part the top surface 12, the bottom surface 14 and the peripheral side surface of the body 10.

The body 10 may comprise a plurality of interconnected matrix regions 24 having the same, or first type conductivity, and the high resistivity of the body 10. In such an instance, the regions 24 spatially isolate each high conductivity channel region 22 from each other.

If the multiple connected regions 24 are each of a high resistivity N-type material, and if each of the low resistivity channel regions 22 are of a second type conductivity, or a P⁺-type region, than a P-N junction 26 is formed by the contiguous surfaces of each pair of mutually adjacent regions 22 and 24. Each P-N junction 26 as formed is very abrupt and distinct resulting in a step junction. The anisotropy of the anisotropic resistor feed, or lead, through will result both from the differences in resistivity between regions 22 and 24 and from the blocking characteristics of the reverse biased P-N junction 26 between regions 22 and 24.

If the multiple connected regions 24 have a high resistivity and N-type conductivity, and if the low resistivity channel regions 22 are N⁺-type conductivity, no P-N junctions will be formed and the anisotropic resistor will operate purely on the difference in resistances between the regions 22 and 24.

Figure 3:
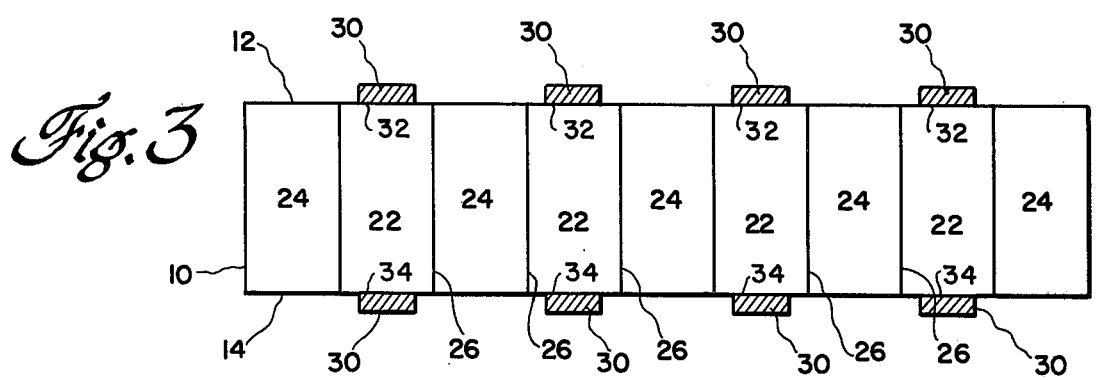

The resulting structure is a body 10 of a matrix semiconductor material of a first level of high resistivity and a first type conductivity in which is disposed a plurality of channel regions 24 of a second level of low resistivity and a second type conductivity. The second type conductivity may be the same as, or the opposite of, that conductivity of the matrix material on the first regions 24 as shown in FIG. 3. Each region 22 is a columnar channel extending through the body 10 and terminating in the opposed surfaces 12 and 14 whose cross section may be triangles or high aspect ratio rectangles for < 111 > axial wafers, squares or high aspect ratio rectangles lying in < 011 > or < 01̄1 > directions for < 100 > axial wafers and diamond parallelograms or high aspect ratio rectangles lying in a < 11̄0 > direction for < 110 > axial wafers.

Ohmic electrical contacts 30 are affixed to the opposed end surfaces 32 and 34 of the regions 24. Electrical leads as required, are affixed to selected contacts 30 to provide one or more electrically conductive paths through the body 10 between the opposed surfaces 12 and 14.

Figure 4:
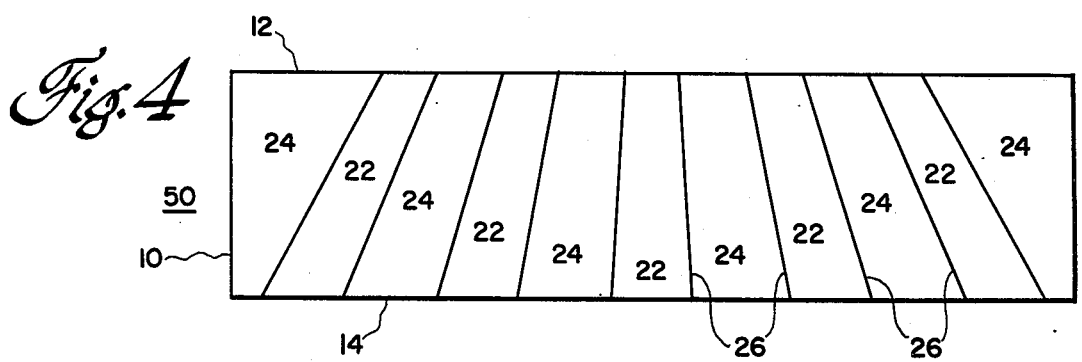

FIG. 4 illustrates an anisotropic resistor 50 which is another embodiment of the anisotropic resistor of this invention wherein the structure has columnar channels, or regions, 22 which are not parallel to each other. All items denoted by the same reference numerals as in FIGS. 1, 2 and 3, are the same as, and function in the same manner, as previously described. The channels, or regions 22, converge towards each other as they pass through body 10 from surface 14 to the opposed surface 12. The structure, as shown, is fabricated by introducing a radial thermal gradient, in addition to the axial thermal gradient, during processing of the wafer, or body, 10. The anisotropic resistor 50 is used as a feed, or lead, through 24 in those situations where the area available for making the electrical contacts to the lead throughs 24 are different on the opposed surfaces 12 and 14 of the lead throughs.

Figure 5:
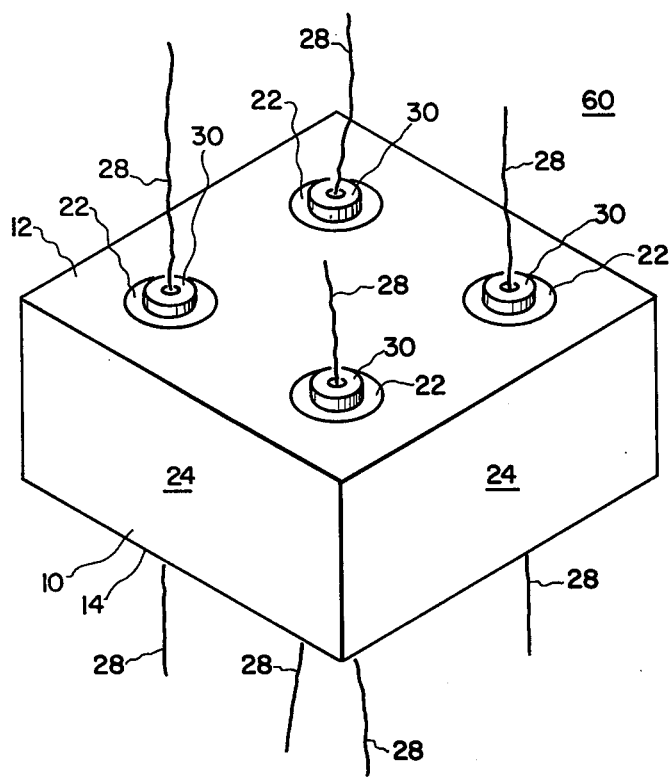
FIG. 5 is an isometric view of a semiconductor device made in accordance with the teachings of this invention.

Referring now to FIG. 5, there is shown an anisotropic resistor feed, or lead, through device 60 made which is another alternate embodiment of the anisotropic resistor of FIG. 3. Those items denoted by the same reference numbers as used in FIG. 3 are the same, and function in the same manner, as described heretofore. Electrical leads 28 are attached to the low resistivity channels 22 via respective ohmic electrical contacts 30 to form the anisotropic resistor feed through 60.

Figure 6:
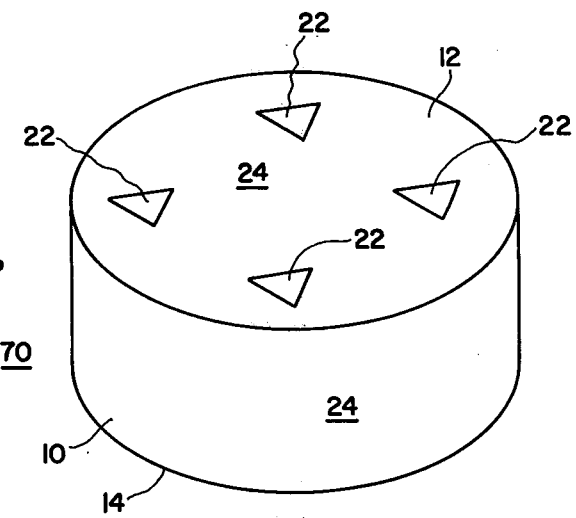
FIG. 6 is an isometric view of an anisotropic resistor processed from a < 111 > wafer of semiconductor material with low resistivity channels of triangular cross section made in accordance with the teachings of this invention.

With reference to FIG. 6, there is shown an anisotropic resistor 70 which is another alternate embodiment of the resistor of FIG. 3. Those items denoted by the same reference numbers as used in FIG. 3 are the same, and function in the same manner, as described heretofore. The resistor 70 is processed from a < 111 > axial wafer of high resistivity semiconductor material of the body 10 with low resistivity channels 22 of triangular cross section whose sides lie in < 11̄0 > line, or wires directions.

Figure 7:
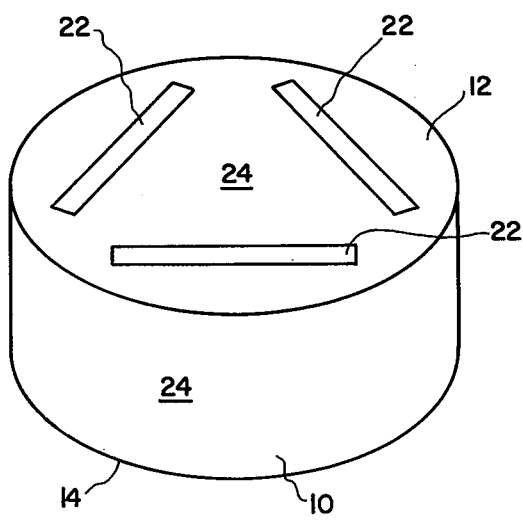
FIG. 7 is an isometric view of an anisotropic resistor processed from a < 111 > wafer with low resistivity channels of a high aspect ratio rectangular cross section made in accordance with the teachings of this invention.

Referring now to FIG. 7, there is shown an anisotropic resistor 80 which is another alternate embodiment of the resistor of FIG. 3. Those items denoted by the same reference numbers as used in FIG. 3 are the same, and function in the same manner, as described heretofore. The resistor 80 is processed from a < 111 > axial wafer of high resistivity semiconductor material of the body 10 with low resistivity channels 22 of a high aspect ratio rectangular shape the major axis of which lies along the < 11̄0 > directions.

With reference to FIG. 8, there is shown an anisotropic resistor 90 which is another alternate embodiment of the resistor of FIG. 3. Those items denoted by the same reference numbers as used in FIG. 3 are the same, and function in the same manner, as described heretofore. The resistor 90 is processed from a < 111 > axial wafer of high resistivity semiconductor material of the body 10 with low resistivity channels 22 of a square cross section whose sides lie in < 011 > and < 01̄1 > wire directions.

Referring now to FIG. 9, there is shown an anisotropic resistor 100 which is another alternate embodiment of the resistor of FIG. 3. Those items denoted by the same reference numbers as used in FIG. 3 are the same, and function in the same manner, as described heretofore. The resistor 100 is processed from a < 100 > axial wafer of high resistivity semiconductor material of the body 10 with low resistivity channels 22 of a of a high aspect ratio rectangular cross section whose major axis lies along either the < 011 > or the < 01̄1 > wire directions.

With reference to FIG. 10, there is shown an anisotropic resistor 110 which is another alternate embodiment of the resistor of FIG. 3. Those items denoted by the same reference numbers as used in FIG. 3 are the same, and function in the same manner, as described heretofore. The resistor 110 is processed from a < 110 > axial wafer of high resistivity semiconductor material of the body 10 with low resistivity channels 22 of a diamond parallelogram cross section.

Referring now to FIG. 11, there is shown an anisotropic resistor 120 which is yet another alternate embodiment of the resistor of FIG. 3. Those items denoted by the same reference numbers as used in FIG. 3 are the same, and function in the same manner, as described heretofore. The resistor 120 is processed from a < 110 > axial wafer of high resistivity semiconductor material of the body 10 with low resistivity channels 22 of a high aspect ratio rectangular cross section lying in the < 1$\bar{1}$0 > wire direction.

Illustrative of the teachings of this invention an anisotropic resistor was manufactured from a < 100 > axial wafer of 5000 ohm-cm silicon semiconductor material of N-type conductivity. The wafer was 1 centimeter in thickness. A square array of aluminum-rich droplets, 5 mils square and arranged on 20 mil centers, were thermally migrated through the silicon wafer at a temperature of 1100° C ± 10° C and employing a temperature gradient of 50° C/cm. The resulting columnar channels were recrystallized material of the wafer now P$^+$ doped and had a carrier concentration of $2 \times 10^{19}$ carriers per cm$^3$. The material of the channels had a resistivity of $7 \times 10^{-3}$ ohm-cm for the columnar channels. The carrier concentration was substantially the same throughout each columnar region as shown by a spreading resistance probe. Since the matrix has a resistivity of $5 \times 10^3$ ohm-cm, the resistance ratio of the columnar regions to the matrix was $5 \times 10^3 / 7 \times 10^{-3} = 7 \times 10^5$.

Electrical leads were ohmicly affixed to the opposed end surfaces of each columnar channels. Each channel region easily conducted electrical energy.

It has been discovered that when the body 10 is of silicon, germanium, silicon carbide, gallium arsenide semiconductor material and the like, the droplet has a preferred shape which also gives rise to the region 24 being of the same shape as the droplet 22. In a crystal axis direction of < 111 > of thermal migration, the droplet migrates as a triangular platelet laying in a (111) plane. The platelet is bounded on its edges by (112) planes. A droplet layer larger than 0.10 centimeter on an edge is unstable and breaks up into several droplets during migration. A droplet smaller than 0.0175 centimeter does not migrate into the body 10 because of a surface barrier problem.

The ratio of the droplet migration rate over the imposed thermal gradient is a function of the temperature at which migration of the droplet is practiced. At high temperatures, of the order of from 1,100° C to 1,400° C, the droplet migration velocity increases rapidly with increasing temperature. A velocity of 10 centimeters per day of $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is decreased by a factor of 200.

A droplet migrates in the < 100 > crystal axis direction as a pyramidal bounded by four forward (111) planes and a rear (100) plane. Careful control of the thermal gradient and migration rate is a necessity. Otherwise, a twisted region 24 may result. It appears that there is a non-uniform dissolution of the four forward (111) facets in that they do not always dissolve at a uniform rate. Non-uniform dissolution of the four forward (111) facets may cause the regular pyramidal shape of the droplet to become distorted in a trapezoidal shape.

Preferred planar orientations, wire directions on the planar surface and axis of migration for material having a desired cubic crystal structure and the like are tabulated in the Table.

Table

| Wafer Plane | Migration Direction | Stable Wire Directions | Stable Wire Sizes |
|---|---|---|---|
| (100) | < 100 > | < 01$\bar{1}$ >* | < 100 microns |
|  |  | < 0$\bar{1}$1 >* | < 100 microns |
| (110) | < 110 > | < 1$\bar{1}$0 >* | < 150 microns |
| (111) | < 111 > | a) < 01$\bar{1}$ > |  |
|  |  | < 10$\bar{1}$ > | < 500 microns |
|  |  | < 1$\bar{1}$0 > |  |
|  |  | b) < 11$\bar{2}$ >* |  |
|  |  | < $\bar{2}$11 >* | < 500 microns |
|  |  | < 1$\bar{2}$1 >* |  |
|  |  | c) Any other Direction in (111) plane | < 500 microns |

*The stability of the migrating wire is sensitive to the alignment of the thermal gradient with the < 100 >, < 110 > and < 111 > axis, respectively.
+ Group a is more stable than group b which is more stable than group c.

Suitable semiconductor materials of this crystal structure are silicon, silicon carbide, germanium and gallium arsenide. For a more complete description of the migration of metal wires, one is directed to our copending patent application "Deep Diode Line Migration", U.S. Pat. No. 3,899,362, and assigned to the same assignee of this invention.

For a more complete description of P-N junction isolation grid structures one is directed to a copending patent application entitled "Isolation Junctions For Semiconductor Devices", Ser. No. 411,012, by Manuel Torreno and assigned to the same assignee as this patent application.

We claim as our invention:
1. An anisotropic resistor comprising
   A body of single crystal semiconductor material having two major opposed surfaces, forming, respectively, the top and bottom surfaces of the body, a first predetermined level of resistivity, a predetermined first type conductivity, a preferred crystal structure and a vertical axis substantially perpendicular to the major opposed surfaces;
   at least one of the opposed major surfaces having a predetermined crystal planar orientation which is one selected from the group consisting of (100), (110) and (111);
   at least one electrically conductive channel region disposed in the body, extending between, and terminating in, the two major opposed surfaces and having opposed end surfaces coextensive with the respective major surface of the body in which the end surface is disposed;
   the material of each channel region comprising recrystallized material of the body formed in situ by the migration of a melt of metal-rich semiconductor material of the body by thermal gradient zone melting at a predetermined elevated temperature along a thermal gradient, established in a predetermined relationship with the opposed major surfaces and the vertical axis of the body, and having the metal of the melt substantially uniformly distributed throughout the entire channel region as an impurity therein, the level of concentration of the metal of the melt in the recrystallized semiconduc- tor region is determined by the solid solubility limit of that metal in that semiconductor material at that predetermined elevated temperature to import a predetermined second type conductivity and a second predetermined level of resistivity thereto, and the body and cash channel region functions as an anisotropic resistor feed through when electrical conducting means are affixed to predetermined surface areas of the same.

2. The anisotropic resistor of claim 1 wherein
the material of the body and the at least one channel region each have the same type conductivity, and
the second selected level of resistivity is less than that of the first selected level of resistivity.

3. The anisotropic resistor of claim 1 wherein
the type conductivity of the at least one channel region is opposite to that of the material of the body, and further including
a P-N junction formed by the contiguous surfaces of the material of each channel region and the material of the body.

4. The anisotropic resistor of claim 1 and further including
a plurality of the spaced channel regions,
the end surfaces of the channel regions disposed in one major surface being spaced a first predetermined distance from each other, and
the end surfaces of channel regions disposed in the other major surface being spaced a second predetermined distance from each other.

5. The anisotropic resistor of claim 1 and further including
at least one first ohmic electrical contact, each first contact being affixed to only one end surface of one channel region, and
at least one second ohmic electrical contact, each second contact being affixed to only the other end surface of the one channel region.

6. The anisotropic resistor of claim 1 wherein
the material of the body is silicon of N-type conductivity, and
the at least one channel region has P-type conductivity and the metal impurity is aluminum.

7. The anisotropic resistor of claim 4 wherein
the material of the body is silicon of N-type conductivity, and
each channel region has P-type conductivity and the metal impurity is aluminum.

8. The anisotropic resistor of claim 1 wherein
the opposed major surfaces have a preferred planar crystal orientation of (111).

9. The anisotropic resistor of claim 8 wherein
the material of the body is one selected from the group consisting of silicon, silicon carbide, germanium and gallium arsenide.

10. The anisotropic resistor of claim 9 wherein
the material of the body is silicon of N-type conductivity, and
the metal impurity is aluminum.

11. The anisotropic resistor of claim 4 wherein
the opposed major surfaces have a preferred planar crystal orientation of (111).

12. The anisotropic resistor of claim 11 wherein
the material of the body is one selected from the group consisting of silicon, silicon carbide, germanium and gallium arsenide.

13. The anisotropic resistor of claim 12 wherein
the material of the body is silicon of N-type conductivity, and
the metal impurity is aluminum.

14. The anisotropic resistor of claim 1 wherein
the opposed major surfaces have a preferred planar crystal orientation of (100).

15. The anisotropic resistor of claim 14 wherein
the material of the body is one selected from the group consisting of silicon, silicon carbide, germanium and gallium arsenide.

16. The anisotropic resistor of claim 15 wherein
the material of the body is silicon of N-type conductivity, and
the metal impurity is aluminum.

17. The anisotropic resistor of claim 4 wherein
the opposed major surfaces have a preferred planar crystal orientation of (110).

18. The anisotropic resistor of claim 17 wherein
the material of the body is one selected from the group consisting of silicon, silicon carbide, germanium and gallium arsenide.

19. The anisotropic resistor of claim 18 wherein
the material of the body is silicon and N-type conductivity, and
the metal impurity is aluminum.

20. The anisotropic resistor of claim 8 wherein
both the preferred vertical axis orientation of the body and the preferred longitudinal axis orientation of each channel region is $< 111 >$.

21. The anisotropic resistor of claim 1 wherein
the opposed major surfaces have a preferred planar crystal orientation of (100), and
both the preferred vertical axis orientation of the body and the preferred longitudinal axis of each channel region is $< 100 >$.

22. The anisotropic resistor of claim 1 wherein
the opposed major surfaces have a preferred planar crystal orientation of (110), and
both the preferred vertical axis orientation of the body and the preferred longitudinal axis of each channel region is $< 110 >$.

23. The anisotropic resistor of claim 8 wherein
at least one of the channel regions is a planar region which has a preferred crystal axis direction.

24. The anisotropic resistor of claim 11 wherein
at least one of the channel regions is a planar region which as a preferred crystal axis direction.

25. The anisotropic resistor of claim 24 wherein
each planar region of second type conductivity has a preferred crystal axis direction which is one selected from the group consisting of $< 01\bar{1} >$, $< 10\bar{1} >$, $< 1\bar{1}0 >$, $< 11\bar{2} >$, $< \bar{2}11 >$ and $< 1\bar{2}1 >$.

26. The anisotropic resistor of claim 14 wherein
at least one channel region is a planar region and has a preferred crystal axis direction selected from the group consisting of $< 011 >$ and $< 0\bar{1}1 >$.

27. The anisotropic resistor of claim 17 wherein
at least one channel region is a planar region and has a preferred crystal direction of $< 1\bar{1}0 >$.

28. The anisotropic resistor of claim 23 wherein
each planar region of second type conductivity has a preferred crystal direction selected from the group consisting of $< 01\bar{1} >$, $< 10\bar{1} >$ and $< 1\bar{1}0 >$.

29. The anisotropic resistor of claim 28 wherein
the material of the body is one selected from the group consisting of silicon, silicon carbide, germanium and gallium arsenide.

30. The anisotropic resistor of claim 29 wherein the material of the body is silicon of N-type conductivity, and the metal impurity is aluminum.

31. The anisotropic resistor of claim 23 wherein each channel region of second type conductivity has a preferred crystal direction selected from the group consisting of $<11\bar{2}<, <\bar{2}11>$ and $<1\bar{2}1>$.

32. The semiconductor device of claim 31 wherein the material of the body is one selected from the group consisting of silicon, silicon carbide, germanium and gallium arsenide.

33. The semiconductor device of claim 32 wherein the material of the body is silicon of N-type conductivity, and the metal impurity is aluminum.

* * * * *